United States Patent
Cheng et al.

(10) Patent No.: US 6,709,897 B2
(45) Date of Patent: Mar. 23, 2004

(54) METHOD OF FORMING IC PACKAGE HAVING UPWARD-FACING CHIP CAVITY

(75) Inventors: Jao-Chin Cheng, Hsinchu (TW); Chih-Peng Fan, Taipei Hsien (TW); David C. H. Cheng, Taoyuan Hsien (TW)

(73) Assignee: Unimicron Technology Corp., Taoyuan Hsien (TW)

( * ) Notice: Subject to any disclaimer, the term of this patent is extended or adjusted under 35 U.S.C. 154(b) by 0 days.

(21) Appl. No.: 10/050,074

(22) Filed: Jan. 15, 2002

(65) Prior Publication Data

US 2003/0134455 A1 Jul. 17, 2003

(51) Int. Cl.[7] .......................... H01L 21/44; H01L 21/48; H01L 21/50
(52) U.S. Cl. ..................... 438/121; 438/122; 438/124; 438/126
(58) Field of Search ................................ 438/108, 119, 438/121, 122, 124, 126, FOR 413, FOR 383, FOR 384, FOR 379; 257/706, 717

(56) References Cited

U.S. PATENT DOCUMENTS 6,274,391 B1 * 8/2001 Wachtler et al. ............... 438/6

FOREIGN PATENT DOCUMENTS

EP 1 251 566 * 10/2002 ............ H01L/33/00

* cited by examiner

Primary Examiner—Olik Chaudhuri
Assistant Examiner—Khiem Nguyen
(74) Attorney, Agent, or Firm—J.C. Patents

(57) ABSTRACT

A method of forming an integrated circuit package with an upward-facing chip cavity such that the fabrication of the substrate and the packaging of silicon chip are combined. By forming a patterned dielectric layer to expose bonding pads on a silicon chip and subsequently connecting the bonding pad on the chip with trace lines on the substrate through electroplating, reliable connections between the chip and substrate are formed and no more bubbles are formed inside the dielectric layer.

30 Claims, 7 Drawing Sheets

METHOD OF FORMING IC PACKAGE HAVING UPWARD-FACING CHIP CAVITY

BACKGROUND OF THE INVENTION

1. Field of Invention

The present invention relates to a method of forming an integrated circuit package having an upward-facing chip cavity. More particularly, the present invention relates to a method of forming an integrated circuit package that combines the processing of substrate board with the packaging of a silicon chip inside an upward-facing cavity.

2. Description of Related Art

As a result of rapid progress in integrated circuit (IC) fabrication techniques and expansion in applications, various types of IC package have been developed. One of the packages is ball grid array (BGA). To form a BGA package, a silicon chip is attached to a substrate and a few solder balls are planted on the substrate. The BGA package makes electrical connection with external devices through the solder balls. In general, there are two major ways of connecting a silicon chip to a substrate. The silicon chip is connected to the substrate either through bumps on a flip chip package or through bonded wires. Before attaching the silicon chip to the substrate, necessary circuit trace and connecting pads for connecting with the silicon chip must be patterned out on the substrate. However, the aforementioned types of chip-to-substrate connections produce a few problems.

To join a chip to the substrate in a flip-chip package, a layer of flux must be applied to the surface of the connecting pads and the chip package must be carefully aligned with the linking pads before applying heat to re-solder all contact points. Since re-soldering in this manner is not highly reliable, partial connection between some of the input/output contacts (bonding pads) on the chip and their corresponding connecting pads on the substrate may result. Repairing such partial contacts once they are formed is usually difficult. In addition, underfill material must be applied to fill up the space between the chip and the substrate in the process of forming the flip-chip package. The filling process demands high ingenuity because air bubbles might be entrenched inside the plastic leading to a low product yield.

On the other hand, if contacts between a silicon chip and a substrate are provided by gold wires, wire bonding strength, connective reliability and signal delay are all problems that need to be considered. Moreover, air bubbles may be trapped inside the plastic material in a subsequent molding process leading to further reliability problems. In addition, spatial limitations also restrict the wire-bonding density.

In brief, conventional chip-to-substrate attachment processes often lead to problems regarding the reliability of connection and the trapping of air bubbles inside underfilling or molding material, especially for a fine-pitch design. Hence, yield of the package is lowered considerably.

SUMMARY OF THE INVENTION

Accordingly, one object of the present invention is to provide a method of forming an integrated circuit package having an upward-facing chip cavity capable of increasing production yield.

A second object of this invention is to provide a method of forming an integrated circuit package having an upward-facing chip cavity that ensures reliable connections between contact points on a silicon chip and corresponding connecting pads on a substrate board.

A third object of this invention is to provide a method of forming an integrated circuit package having an upward-facing chip cavity that avoids the trapping of bubbles inside underfilling and molding material.

To achieve these and other advantages and in accordance with the purpose of the invention, as embodied and broadly described herein, the invention provides a method of forming an integrated circuit package with an upward-facing chip cavity. First, a substrate is provided. A first opening that passes through the substrate is formed. A thermal conductive layer is joined to the lower surface of the substrate through the application of pressure. The first opening exposes a portion of the thermal conductive layer. A silicon chip is attached to the exposed upper surface of the thermal conductive layer inside the first opening. The silicon chip has an active surface and a backside surface. The active surface further includes a plurality of bonding pads thereon. The backside of the silicon chip is in contact with the upper surface of the thermal conductive layer so that the chip is fixed in position. A dielectric layer is formed to fill the first opening and cover the substrate as well as the active surface and the bonding pads of the silicon chip. The dielectric layer and the substrate are patterned to form a plurality of second openings that expose the bonding pads. A plurality of third openings that passes through the dielectric layer and the substrate and exposes a portion of the thermal conductive layer is formed. A metallic layer is formed over the exposed surface of the second openings, the third openings and the dielectric layer by electroplating. The metallic layer is patterned to form a patterned metallic layer. A patterned solder resistant layer is formed over the patterned metallic layer. The patterned solder resistant layer has a plurality of fourth openings that expose a portion of the patterned metallic layer. A solder ball planting operating is carried out to place one solder ball over each fourth opening. The solder ball is heated to form electrical connection between the solder ball and the patterned metallic layer.

This invention also provides an alternative method of forming an integrated circuit package having an upward-facing chip cavity. First a substrate having a cavity section therein is provided. A silicon chip is attached to the cavity section of the substrate. The silicon chip has an active surface and a backside surface. The active surface further includes a plurality of bonding pads thereon. The backside of the silicon chip is in contact with the cavity section of the substrate so that the chip is fixed in position. A patterned dielectric layer is formed to fill the cavity section and cover the active surface and the bonding pads of the silicon chip. The patterned dielectric layer has a plurality of second openings and a plurality of third openings. The second openings expose the bonding pads while the third openings pass through the patterned dielectric layer and expose a portion of the substrate. A metallic layer is formed over the exposed surface of the second openings, the third openings and the dielectric layer by electroplating. The metallic layer is patterned to form a patterned metallic layer. A patterned solder resistant layer is formed over the patterned metallic layer. The patterned solder resistant layer has a plurality of fourth openings that expose a portion of the patterned metallic layer. A solder ball planting operating is carried out to place one solder ball over each fourth opening. The solder ball is heated to form electrical connection between the solder ball and the patterned metallic layer.

One major aspect of this invention is the combination of substrate processing and chip packaging leading to a greater flexibility in manufacturing.

A second major aspect of this invention is the formation of a patterned dielectric layer to expose the bonding pads on the chip before performing an electroplating for connecting the bonding pads and the substrate pads electrically. Hence, superior electrical contact between the chip and the substrate is formed and reliable connection between the chip and the substrate is ensured.

A third major aspect of this invention is the formation of the patterned dielectric layer before coating a layer of metal over the patterned dielectric layer by electroplating. This sequence of processing steps prevents the formation of any bubbles inside the patterned dielectric layer. Consequently, conventional problems caused by trapped bubbles inside underfilling or molding material are entirely avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
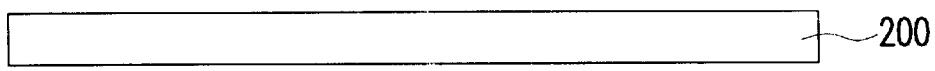
FIGS. 1~13 are schematic cross-sectional views showing the progression of steps for producing an integrated circuit package with an upward-facing chip cavity according to the first embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1~13 are schematic cross-sectional views showing the progression of steps for producing an integrated circuit package with an upward-facing chip cavity according to the first embodiment of this invention.

Figure 2:
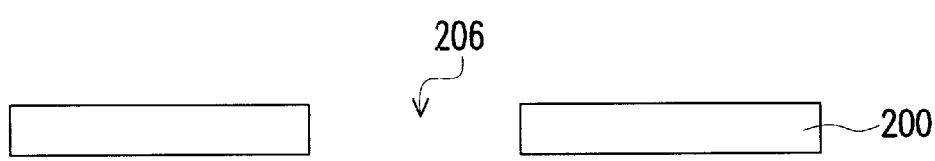
Figure 3:
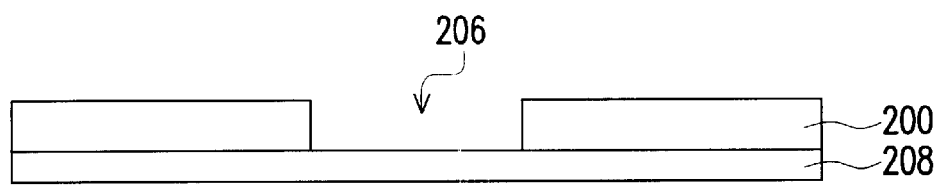

As shown in FIG. 1, a substrate 200 is provided. The substrate is an insulating layer. As shown in FIG. 2, an opening 206 that passes through the substrate 200 is formed. The opening 206 is formed, for example, by a hole-punching operation. As shown in FIG. 3, a thermal conductive layer 208 is attached to the lower surface of the substrate 200 through the application of pressure. The opening 206 exposes a portion of the thermal conductive layer 208. The thermal conductive layer 208 is made from a metallic material such as copper. To join the thermal conductive layer 208 with the substrate 200, a thermal conductive glue (not shown) is applied to the upper surface of the thermal conductive layer 208 before pressing the substrate and the thermal conductive layer 208 together.

Figure 4:
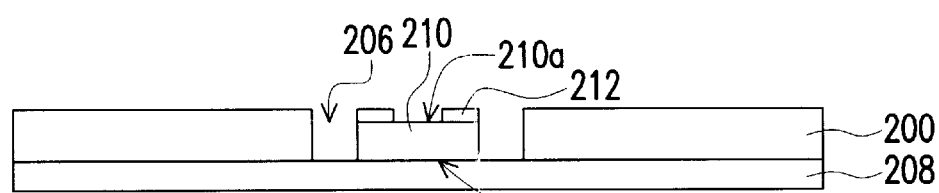

As shown in FIG. 4, a silicon chip 210 is attached to the exposed upper surface of the thermal conductive layer 208 inside the opening 206. The silicon chip 210 has an active surface 210a and a backside surface 210b. The silicon chip 210 further includes a plurality of bonding pads 212 on the active surface 210a. By attaching the backside 210b of the chip 210 onto the thermal conductive glue (not shown) over the thermal conductive layer 208, the chip 210 is fixed in position.

Figure 5:
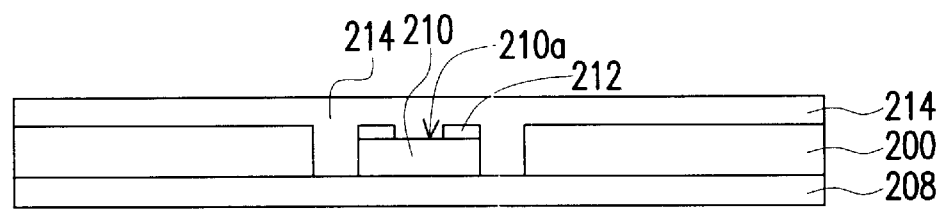
Figure 6:
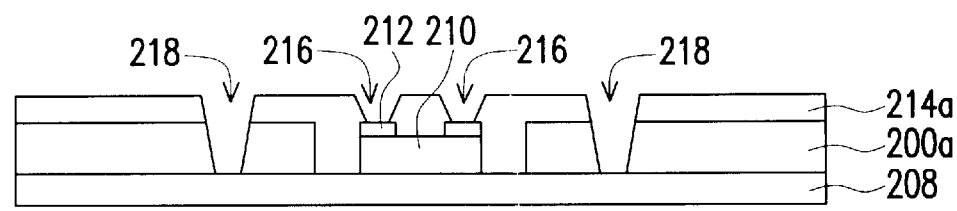

As shown in FIG. 5, a dielectric layer 214 is formed filling the opening 206 and covering the substrate 200, the active surface 210a and the bonding pads 212 of the silicon chip 210. As shown in FIG. 6, the dielectric layer 214 and the substrate 200 are patterned to form a plurality of openings 216 that expose the bonding pads 212 and a plurality of openings 218 that pass through the dielectric layer 214 and the substrate 200 and expose the thermal conductive layer 208, thereby forming a patterned dielectric layer 214a and substrate 200a. The openings 216 are formed, for example, by laser drilling. Other method such as photolithographic and etching processes for forming the openings 216 is permissible. To form the openings 216 by photolithographic and etching processes, a patterned photoresist layer (not shown) is formed over the dielectric layer 214 and then the dielectric layer 214 is etched using the patterned photoresist layer as a mask. The third openings 218 are formed, for example, by mechanical drilling.

Figure 7:
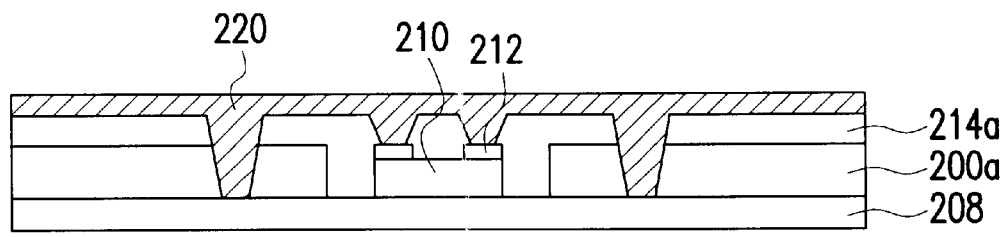
Figure 8:
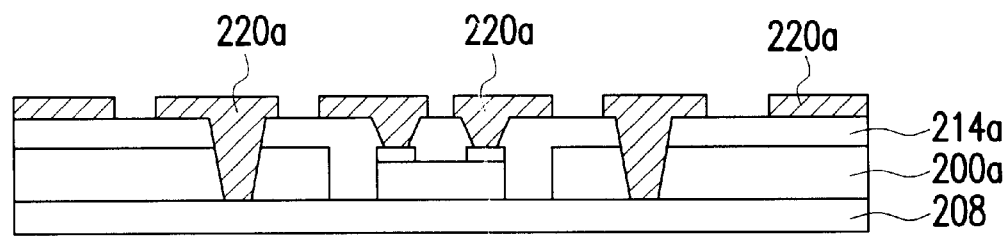

As shown in FIG. 7, a metallic layer 220 is formed over the exposed surface of the openings 216, the openings 218 and the dielectric layer 214a by electroplating. As shown in FIG. 8, the metallic layer 220 is patterned to form a patterned metallic layer 220a.

Figure 9:
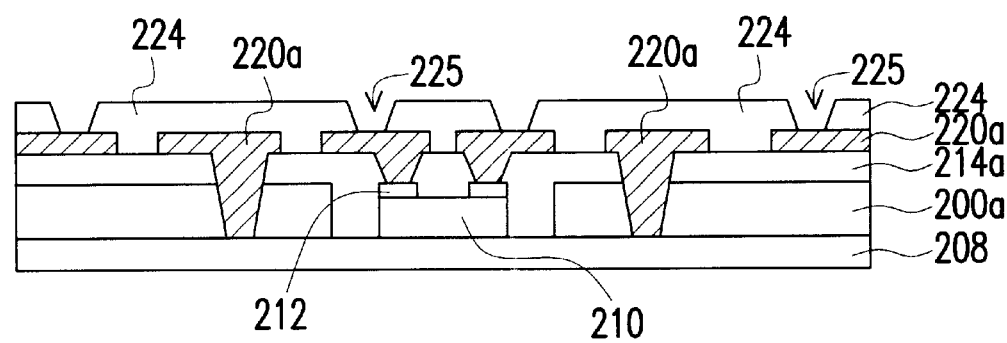
Figure 10:
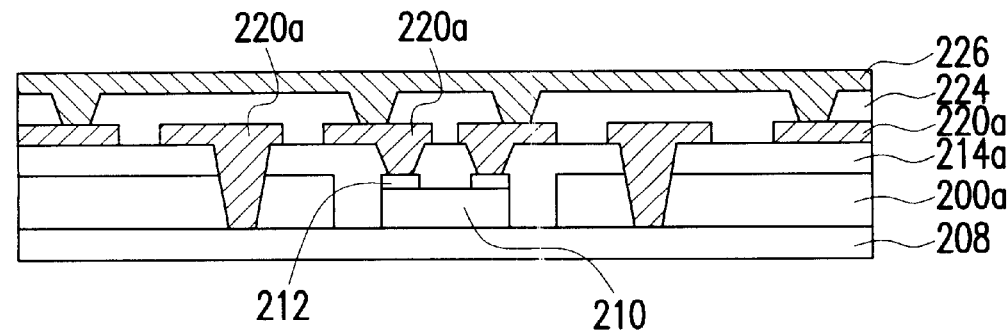
Figure 11:
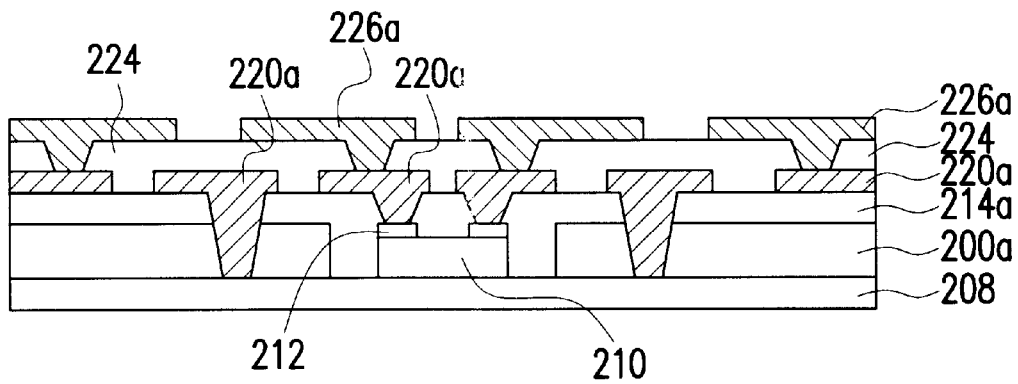

As shown in FIG. 9, a patterned dielectric layer 224 is formed over the patterned metallic layer 220a. The patterned dielectric layer has a plurality of openings 225 that expose a portion of the patterned metallic layer 220a. Thereafter, as shown in FIG. 10, a metallic layer 226 is coated over the exposed surface of the opening 225 and the patterned dielectric layer 224. As shown in FIG. 11, the metallic layer 226 is patterned to form a patterned metallic layer 226a. The method of forming various dielectric layers includes, for example, spot gluing. In addition, before patterning various dielectric layers and various metallic layers, the process further includes planarizing the dielectric layers and the metallic layers. The method of planarization includes, for example, chemical-mechanical polishing.

Figure 12:
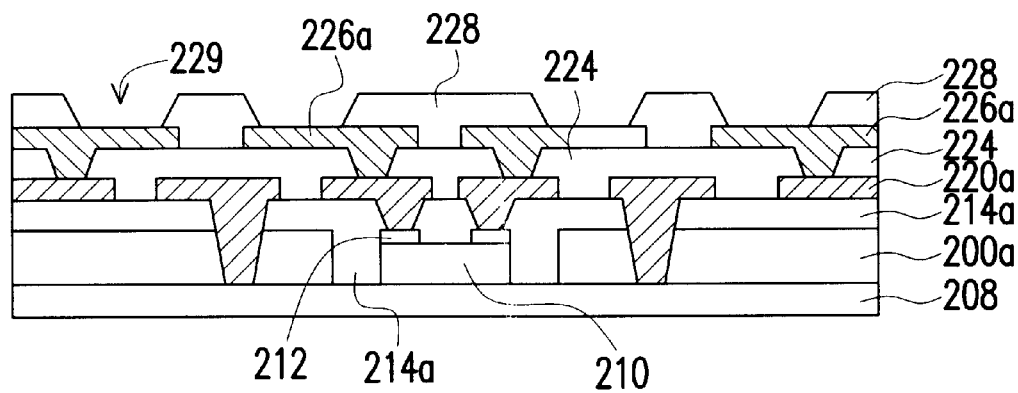

As shown in FIG. 12, a patterned solder resistant layer 228 is formed over the surface of the patterned metallic layer 226a. The patterned solder resistant layer 228 has a plurality of openings 229 that expose a portion of the patterned metallic layer 226a.

Figure 13:
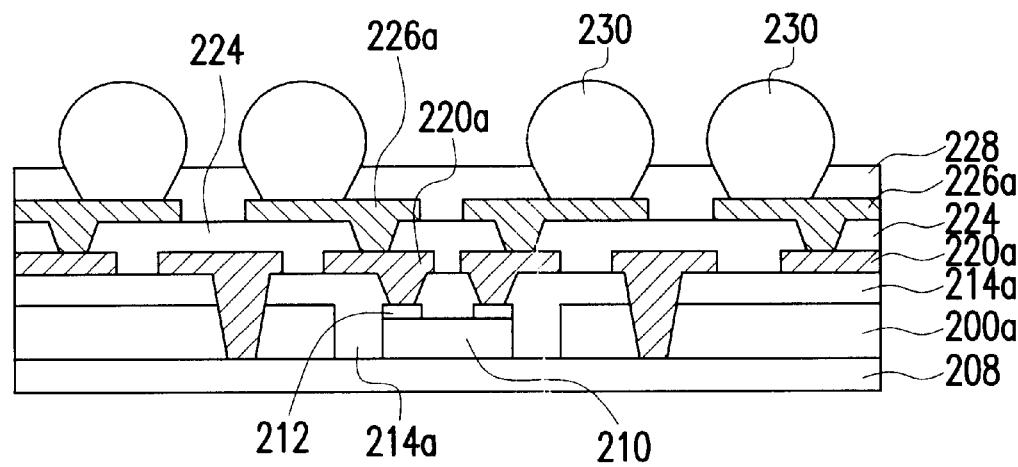

Finally, as shown in FIG. 13, a solder ball 230 is placed over one end of each opening 229. The solder balls 230 and the patterned metallic layer 226a are heated (a reflow step) so that the solder balls form an electrical connection with a section of the patterned metallic layer 226a. The thermal conductive layer strengthens the dissipation of heat from the silicon chip.

There are two patterned metallic layers in the aforementioned embodiment. However, according to spirit of this invention, the number of patterned metallic layers is not limited to two. In practice, steps carried out from FIGS. 9~11 (including the formation of a patterned dielectric layer, the formation of a metallic layer by electroplating and the patterning of the metallic layer) may be repeated to obtain the required number of layers and trace line pattern.

FIGS. 14~24 are schematic cross-sectional views showing the progression of steps for producing an integrated circuit package with an upward-facing chip cavity according to the second embodiment of this invention.

Figure 14:
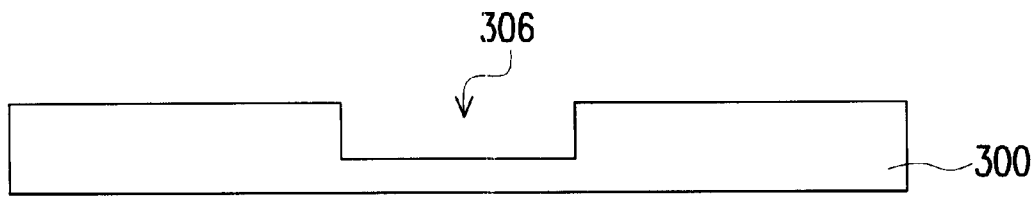
FIGS. 14~24 are schematic cross-sectional views showing the progression of steps for producing an integrated circuit package with an upward-facing chip cavity according to the second embodiment of this invention.

As shown in FIG. 14, a substrate 300 having a cavity section 306 thereon is provided. The substrate 300 is formed, for example, by etching a metallic plate such as a copper plate to form the cavity section 306.

Figure 15:
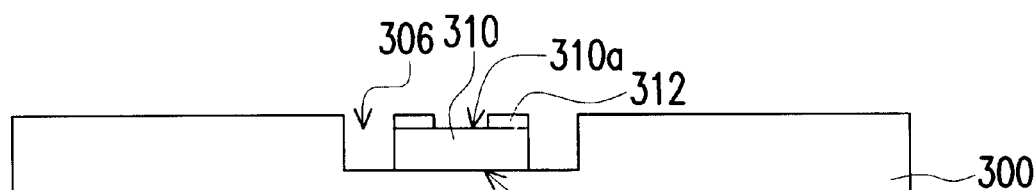

As shown in FIG. 15, thermal conductive glue (not shown) is smeared onto the bottom of the cavity section 306 and then a silicon chip 310 is attached to the surface inside the cavity 306. The silicon chip 310 has an active surface 310a and a backside surface 310b. The silicon chip 310 further includes a plurality of bonding pads 312 on the active surface 310a. By attaching the backside 310b of the chip 310 onto the thermal conductive glue (not shown) inside the cavity section 306 of the substrate 300, the chip 310 is fixed in position.

Figure 16:
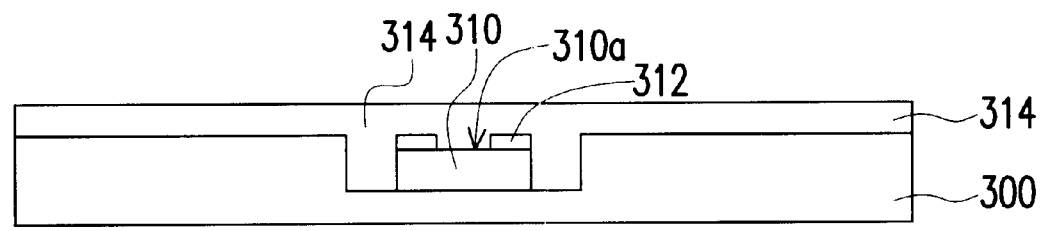
Figure 17:
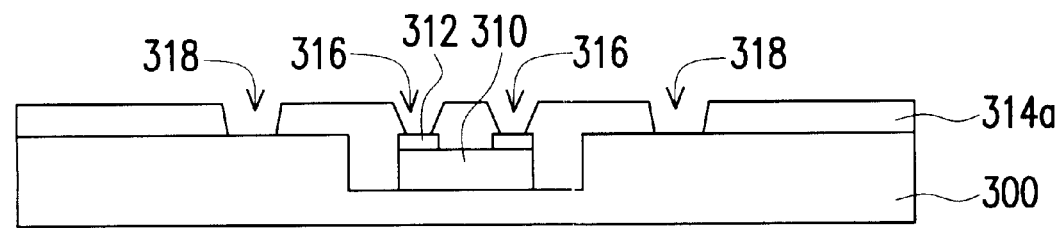

As shown in FIG. 16, a dielectric layer 314 is formed filling the cavity section 306 and covering the substrate 300, the active surface 310a and the bonding pads 312 of the silicon chip 310. As shown in FIG. 17, the dielectric layer 314 is patterned to form a patterned dielectric layer 314a having a plurality of openings 316 that expose the bonding pads 312 and a plurality of openings 318 that pass through the dielectric layer 214 and expose the substrate 300.

The patterned dielectric layer 314a is formed, for example, by depositing dielectric material to form the dielectric layer 314 that fills the cavity 306 and covers the substrate 300, the active surface 310a and bonding pads 312 of the silicon chip 310. Thereafter, the openings 316 are formed in the dielectric layer 314 to expose the bonding pads 312. Finally, the openings 318 that pass through the dielectric layer 312 and expose a portion of the substrate 300 are formed. The openings 316 are formed, for example, by laser drilling. Other methods such as photolithographic and etching processes for forming the openings 316 are permissible. To form the openings 316 by photolithographic and etching processes, a patterned photoresist layer (not shown) is formed over the dielectric layer 314 and then the dielectric layer 314 is etched using the patterned photoresist layer as a mask. The third openings 318 are formed, for example, by mechanical drilling.

In general, the dielectric layer 314 is planarized before forming the openings 316. The dielectric layer 314 is planarized, for example, by chemical-mechanical polishing.

Figure 18:
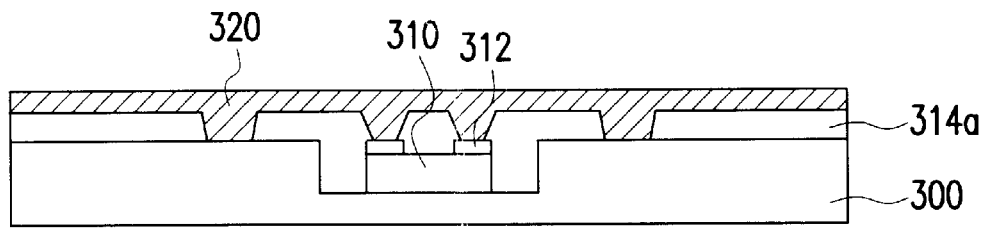
Figure 19:
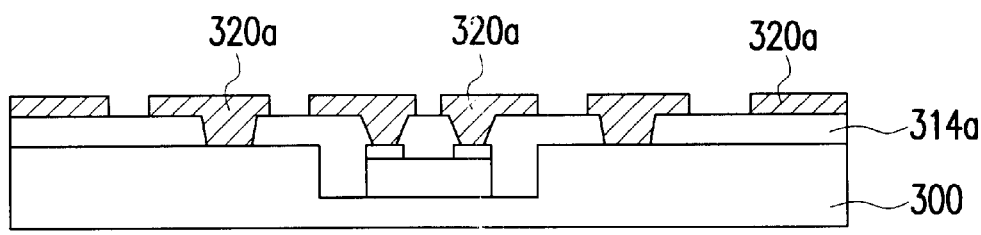

As shown in FIG. 18, a metallic layer 320 is formed over the exposed surface of the openings 316, the openings 318 and the dielectric layer 314a by electroplating. As shown in FIG. 19, the metallic layer 320 is patterned to form a patterned metallic layer 320a.

Figure 20:
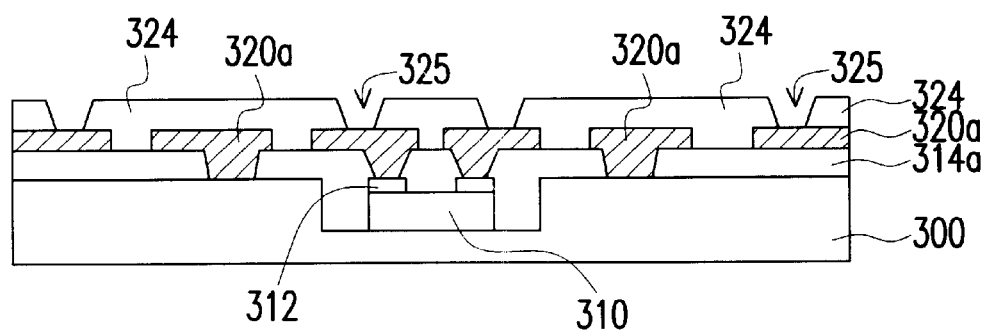
Figure 21:
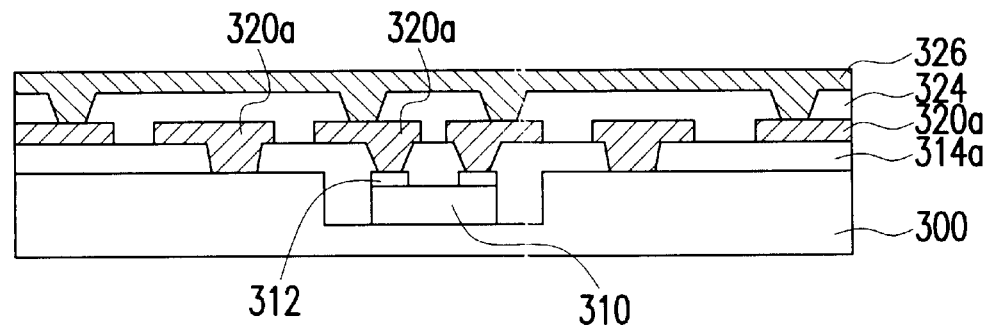
Figure 22:
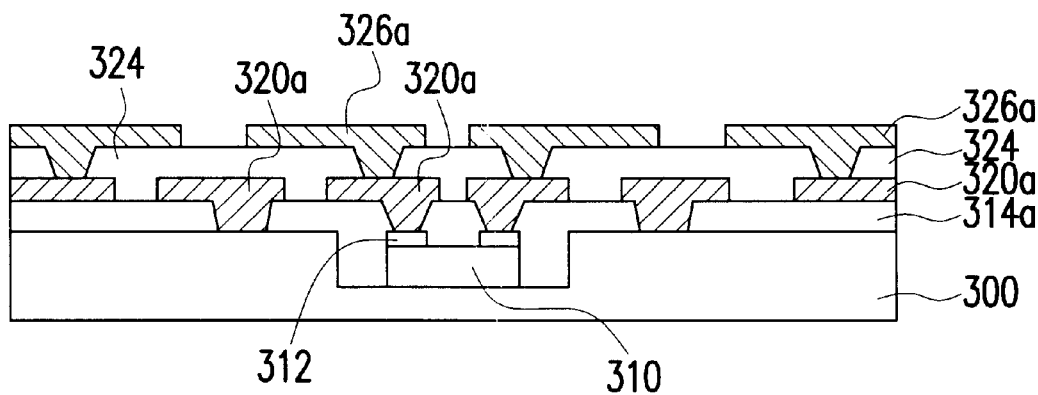

As shown in FIG. 20, a patterned dielectric layer 324 is formed over the patterned metallic layer 320a. The patterned dielectric layer 324 has a plurality of openings 325 that expose a portion of the patterned metallic layer 320a. Thereafter, as shown in FIG. 21, a metallic layer 326 is coated over the exposed surface of the opening 325 and the patterned dielectric layer 324. As shown in FIG. 22, the metallic layer 326 is patterned to form a patterned metallic layer 326a. In addition, before patterning various dielectric layers and various metallic layers, the process further includes planarizing the dielectric layers and the metallic layers. The method of planarization includes, for example, chemical-mechanical polishing.

Figure 23:
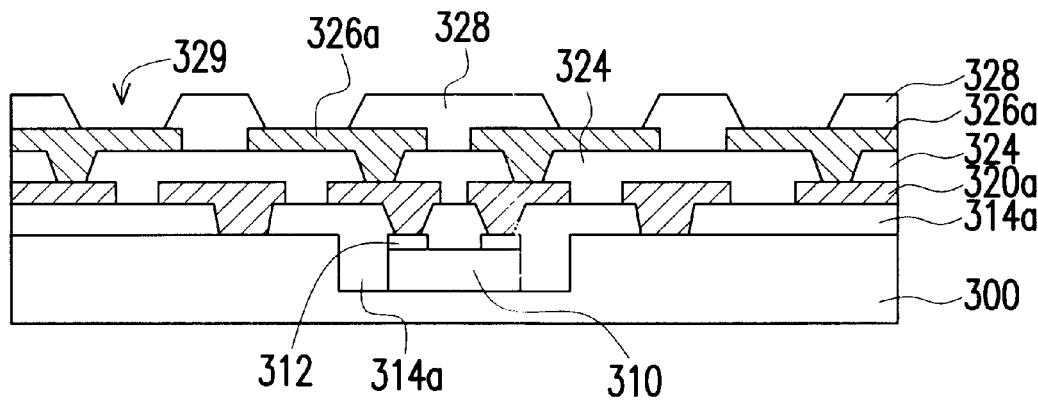

As shown in FIG. 23, a patterned solder resistant layer 328 is formed over the surface of the patterned metallic layer 326a. The patterned solder resistant layer 328 has a plurality of openings 329 that expose a portion of the patterned metallic layer 326a.

Figure 24:
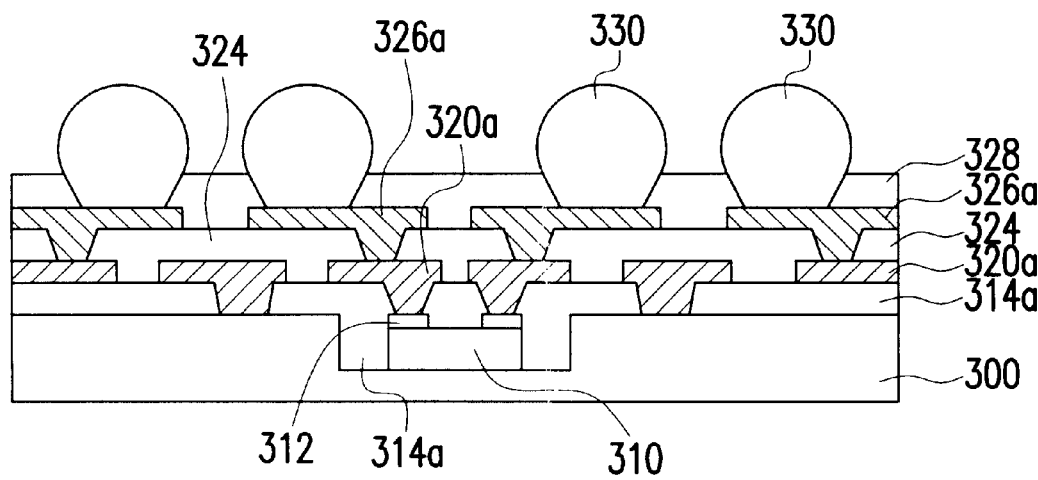

Finally, as shown in FIG. 24, a solder ball 330 is placed over one end of each opening 229. The solder balls 330 and the patterned metallic layer 326a are heated (a reflow step) so that the solder balls form an electrical connection with a section of the patterned metallic layer 326a.

Figure 25:
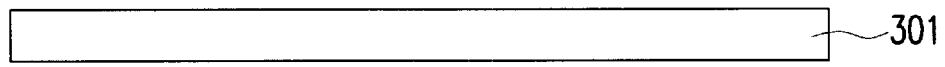
FIGS. 25~27 are schematic cross-sectional views showing the steps for producing the substrate according to the second embodiment of this invention.
Figure 26:
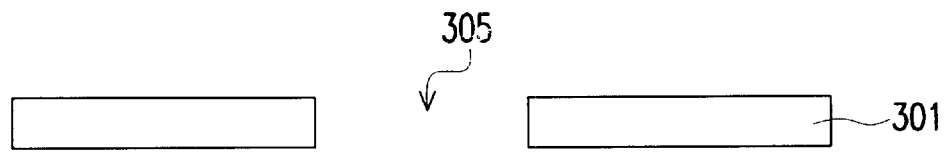
Figure 27:
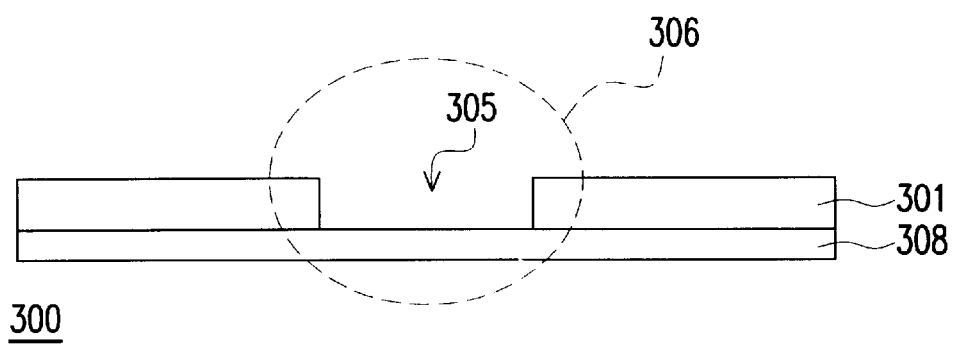

The substrate 300 with a cavity section thereon as shown in FIG. 14 is given as an example. FIGS. 25~27 are schematic cross-sectional views showing the steps for producing the substrate according to the second embodiment of this invention.

As shown in FIG. 25, a metallic plate 301 such as a copper plate is provided. As shown in FIG. 26, a through hole 305 is formed in the metallic plate 301. The through hole 305 is formed, for example, by mechanical drilling. Thereafter, as shown in FIG. 27, thermal conductive glue (not shown) is coated over the upper surface of a thermal conductive plate 308. The thermal conductive plate 308 with the glue and the upper surface of the metallic plate 301 are pressed together and bonded with each other after the glue solidifies. The through hole 305 and the thermal conductive plate 308 together constitute a cavity 306. The silicon chip 310 is bonded to the bottom surface of the cavity 306 and fixed relative to the substrate 300 through the thermal conductive glue on the upper surface of the thermal conductive plate 308. The thermal conductive plate 308 can be a copper plate, for example. In the second embodiment, the thermal conductive plate 308 need not be a metallic layer (due to the need to electroplate, the thermal conductive layer 208 in FIG. 7 of the first embodiment is a metallic layer). Any material having relatively good thermal conductivity is suitable because a principle function of the thermal conductive plate is to channel heat away from the silicon chip as soon as possible.

There are two patterned metallic layers in the aforementioned embodiment. However, according to the spirit of this invention, the number of patterned metallic layers is not limited to two. In practice, steps for forming a patterned dielectric layer, forming a metallic layer by electroplating and patterning the metallic layer may be repeated to obtain the required number of layers and trace line patterns.

One major aspect of this invention is the combination of substrate processing and chip packaging leading to greater flexibility in manufacturing.

A second major aspect of this invention is the formation of a patterned dielectric layer to expose the bonding pads on the chip before performing an electroplating for connecting the bonding pads and the substrate pads electrically. Hence, compared with the connection between the bumps and substrate in a conventional flip-chip package, superior electrical contact between the chip and the substrate is formed and reliable connection between the chip and the substrate is ensured.

A third major aspect of this invention is the formation of the patterned dielectric layer before coating a layer of metal over the patterned dielectric layer by electroplating. This sequence of processing steps prevents the formation of any bubbles inside the patterned dielectric layer. Consequently, problems caused by trapped bubbles inside underfilling or molding material are entirely avoided.

In this invention, the silicon chip is attached to the substrate before processing steps including the patterning of the dielectric layer and the forming of a metallic layer by electroplating necessary for connecting the substrate and the chip electrically are carried out. Thereafter, the metallic layer and the conductive layer are patterned to form electrical trace lines in the substrate. Since the precision in each subsequent step is gradually relaxed, product yield is increased. The connection between the silicon chip and the substrate in a conventional method, on the other hand, is conducted only after the substrate trace lines and connective pad pattern are formed. Because the silicon chip demands high precision (front-end section of semiconductor manufacturing) while the substrate demands a lower precision (relative to the front-end section), connecting the silicon chip (high precision) to the substrate (low precision) after the substrate is manufactured requires an increase in precision (to match with the chip). Hence, product yield is often difficult to control.

In conclusion, major advantages of this invention include:
1. The IC packing method assimilates the fabrication of the substrate with packaging the chip so that manufacturing flow is smoother and more flexible.
2. By forming the patterned dielectric layer to expose bonding pads on a silicon chip before conducting an electroplating to connect the bonding pads with corresponding contacts on the substrate, reliable connections between the chip and the substrate are ensured.
3. Similar to the above, problems caused by bubbles trapping inside underfilling material or molding compound are entirely avoided.
4. Compared with a conventional method of joining the chip and the substrate, the precision requirements in the steps for forming the package are gradually relaxed so that overall product yield is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming an integrated circuit package having an upward-facing chip cavity, comprising the steps of:
    providing a substrate;
    forming a first opening in the substrate, wherein the first opening passes through the substrate;
    pressing a thermal conductive plate against the lower surface of the substrate so that the first opening exposes a portion of the upper surface of the thermal conductive plate;
    attaching a silicon chip to the exposed upper surface of the thermal conductive plate inside the first opening, wherein the silicon chip has an active surface and a backside surface, the active surface further includes a plurality of bonding pads while the backside of the silicon chip adheres to the upper surface of the thermal conductive plate so that the chip is fixed in position;
    forming a dielectric layer that fills the first opening and covers the substrate, the active surface and the bonding pads of the silicon chip;
    patterning the dielectric layer to form a plurality of second openings that expose the bonding pads and a plurality of third openings that pass through the dielectric layer and the substrate and expose a portion of the thermal conductive plate;
    conducting an electroplating operation to form a metallic layer over the exposed surface of the second openings, the third openings and the dielectric layer;
    patterning the metallic layer to form a patterned metallic layer; forming a patterned solder resistant layer over the patterned metallic layer, wherein the patterned solder resistant layer has a plurality of fourth openings that expose a portion of the patterned metallic layer; and
    planting a solder ball over one end of each fourth opening and heating the solder ball to form electrical contact between the solder ball and metallic layer.

2. The method of claim 1, wherein the substrate includes an insulating layer.

3. The method of claim 1, wherein the thermal conductive plate includes a metallic plate.

4. The method of claim 3, wherein the thermal conductive plate includes a copper plate.

5. The method of claim 1, wherein the step for forming the first opening includes hole punching.

6. The method of claim 1, wherein the step for forming the second openings includes laser drilling.

7. The method of claim 1, wherein the step of forming the second openings further includes the sub-steps of:
    forming a patterned photoresist layer over the dielectric layer; and
    etching the dielectric layer using the patterned photoresist layer as a mask until the bonding pads are exposed.

8. The method of claim 1, wherein the step for forming the third openings includes mechanical drilling.

9. The method of claim 1, wherein the step for forming the dielectric layer includes spot gluing.

10. The method of claim 1, wherein the step for forming the substrate includes coating a layer of thermal conductive glue over the upper surface of the thermal conductive plate and pressing the thermal conductive plate and the substrate together and the step of fixing the silicon chip relative to the substrate includes attaching the chip to the thermal conductive plate through the thermal conductive glue.

11. The method of claim 1, wherein before the step of patterning the dielectric layer, further includes planarizing the dielectric layer to form a flat dielectric surface.

12. The method of claim 11, wherein the step of planarizing the dielectric layer includes chemical-mechanical polishing.

13. The method of claim 1, wherein before the step of patterning the metallic layer, further includes planarizing the metallic layer to form a flat metallic surface.

14. The method of claim 13, wherein the step of planarizing the metallic layer includes chemical-mechanical polishing.

15. A method of forming an integrated circuit package having an upward-facing chip cavity, comprising the steps of:
    providing a substrate having a cavity section thereon;
    attaching a silicon chip to the bottom surface of the cavity; wherein the silicon chip has an active surface and a backside surface, the active surface further includes a plurality of bonding pads while the backside of the silicon chip adheres to the bottom surface of the cavity so that the chip is fixed relative to the substrate;
    forming a patterned dielectric layer that fills the cavity section and covers the substrate, the active surface and the bonding pads of the silicon chip, wherein the patterned dielectric layer has a plurality of second openings that expose the bonding pads and a plurality of third openings that pass through the patterned dielectric layer and expose a portion of the substrate;
    conducting an electroplating operation to form a metallic layer over the exposed surface of the second openings, the third openings and the patterned dielectric layer,
    patterning the metallic layer to form a patterned metallic layer;

forming a patterned solder resistant layer over the patterned metallic layer, wherein the patterned solder resistant layer has a plurality of fourth openings that expose a portion of the patterned metallic layer; and planting a solder ball over one end of each fourth opening and heating the solder ball to form electrical contact between the solder ball and the patterned metallic layer.

16. The method of claim 15, wherein the step of forming the substrate includes the sub-steps of:

providing a metallic plate;

forming a hole through the metallic plate; and pressing a thermal conductive plate against the lower surface of the metallic plate so that the through hole and the thermal conductive plate together form a cavity.

17. The method of claim 16, wherein the step of forming the through hole includes mechanical drilling.

18. The method of claim 16, wherein the thermal conductive plate includes a copper plate.

19. The method of claim 16, wherein the step for forming the substrate further includes coating a layer of thermal conductive glue over the upper surface of the thermal conductive plate and pressing the thermal conductive plate and the metallic plate together and the step of fixing the silicon chip relative to the substrate includes attaching the chip to the thermal conductive plate through the thermal conductive glue.

20. The method of claim 15, wherein before the step of patterning the metallic layer, further includes planarizing the metallic layer to form a flat metallic surface.

21. The method of claim 20, wherein the step of planarizing the metallic layer includes chemical-mechanical polishing.

22. The method of claim 15, wherein the step of forming the substrate includes the sub-steps of:

providing a metallic plate; and forming a cavity in the metallic plate.

23. The method of claim 22, wherein the method further includes smearing a layer of thermal conductive glue over the bottom surface of the cavity and fixing the silicon chip to the bottom of the cavity through the glue.

24. The method of claim 22, wherein the step of forming the cavity in the substrate includes etching.

25. The method of claim 15, wherein the step of forming the patterned dielectric layer includes the sub-steps of:

depositing dielectric material to fill the cavity section and cover the substrate, the active surface and the bonding pads of the silicon chip;

forming the second openings that expose the bonding pads in the dielectric layer; and forming the third openings that pass through the dielectric layer and expose a portion of the substrate.

26. The method of claim 25, wherein the step for forming the second openings includes laser drilling.

27. The method of claim 25, wherein the step of forming the second openings further includes the sub-steps of:

forming a patterned photoresist layer over the dielectric layer; and etching the dielectric layer using the patterned photoresist layer as a mask until the bonding pads are exposed.

28. The method of claim 25, wherein the step for forming the third openings includes mechanical drilling.

29. The method of claim 25, wherein before the step of forming the second openings, further includes planarizing the dielectric layer to form a flat dielectric surface.

30. The method of claim 29, wherein the step of planarizing the dielectric layer includes chemical-mechanical polishing.

* * * * *